United States Patent [19]
May et al.

[11] Patent Number: 5,640,460
[45] Date of Patent: Jun. 17, 1997

[54] AMPLITUDE ADJUST CIRCUIT AND METHOD THEREOF

[75] Inventors: Marcus W. May; C. Eric Seaberg, both of Austin, Tex.

[73] Assignee: Motorola Inc., Schaumburg, Ill.

[21] Appl. No.: 415,915

[22] Filed: Apr. 3, 1995

[51] Int. Cl.$^6$ .................................................. H03G 7/00
[52] U.S. Cl. ............................................ 381/106; 381/104
[58] Field of Search ............................. 381/94, 104, 106, 381/107, 109, 120; 330/9, 261, 284

[56] References Cited

U.S. PATENT DOCUMENTS

| | | | |
|---|---|---|---|
| 5,201,009 | 4/1993 | Yamada et al. | 381/94 |
| 5,264,804 | 11/1993 | Fox | 330/9 |
| 5,365,195 | 11/1994 | Kageyama | 330/284 |

Primary Examiner—Curtis Kuntz
Assistant Examiner—Vivian W. Chang

[57] ABSTRACT

An amplitude adjust circuit (10) provides a scaled representation (36) of an analog audio signal (28) with substantially zero DC offset relative to a reference voltage. A voltage reference generator (12) produces a voltage reference (20) that inputs to an operational amplifier (14). The offsetting circuit (16) offsets an analog audio signal (28) by a DC component substantially equal to the voltage reference (20) and provides the result as an input to the operational amplifier (14). The operational amplifier (14) produces an output with a DC component substantially equal to the voltage reference (20). The impedance network (18) operably couples to the operational amplifier (14) output and to the voltage reference (20) so that both sides of the impedance network (18) are held at the voltage reference (20) level. Based on a amplitude select signal (36), one of a plurality of impedances (32) of the impedance network (18) is selected to provide a scaled representation (36) of the analog audio signal (28) with substantially zero DC offset.

14 Claims, 5 Drawing Sheets

1

AMPLITUDE ADJUST CIRCUIT AND METHOD THEREOF

FIELD OF THE INVENTION

The present invention relates generally to the scaling of analog signals and more particularly to a volume adjust circuit that provides a scaled analog audio signal with zero DC offset.

BACKGROUND OF THE INVENTION

The scaling of analog signals has been known in the art for years. Typically, an analog signal is scaled by applying a full scale signal across a plurality of impedances connected in series. The plurality of impedances, typically resistors, are connected in series to provide a resistive divider where one end of the series impedances is coupled to ground potential while the other end receives the full scale audio signal. A scaled output is then extracted from one of a plurality of tap points located along the series impedance. By varying the tap point from which the scaled output is extracted, the magnitude of the scaled output is varied. Because of the simplicity, effectiveness, and low cost of the technique, the technique remains widely used today.

With the advent of digital circuitry, it has become common to digitally encode analog signals, such as audio signals, and to convert the digital signals back to analog signals prior to transmitting the audio signals to a user. For example, digital audio disks, otherwise known as compact discs, store audio information in a digital format on a substrate that is sensitive to the emission of light. A laser beam is bounced off the substrate such that a stream of digital data is received. The digital data is provided to a digital to analog (D/A) converter, which converts the digital data to an equivalent analog output. Typically, the analog output is reconstructed by selectively controlling the output of a plurality of current sources based upon the magnitude of the digital audio signal at a specific sampling period. Thus, an analog wave form is rebuilt using the output of a plurality of current sources. The analog wave form represents the audio signal and typically is used to provide a scaled audio signal in the manner described above.

One drawback to almost all audio signal adjust circuits is caused by the interaction between the circuitry generating the full scale audio signal and the circuitry used to generate a scaled audio signal. As previously described, signal adjust circuits typically apply an analog signal across a distributed series impedance and derive a scaled output by tapping the series impedance. Obtaining a differing scaled audio output is performed by extracting the scaled signal from a different tap point on a series impedance. However, because a DC voltage also appears across the series impedance, changing a tap point causes the DC level of the scaled output to change as well.

The change in DC level, or DC offset, of an audio signal causes speakers receiving the signal to produce an audible "pop". Over time, the DC offset will damage the sensitive coils in the speakers. Even though the DC offset is often not large enough to immediately cause physical damage to the speaker, DC offset will reduce the life span of the speakers. Because the DC offset appears as a step function, the change in DC offset, viewed from a frequency standpoint, contains many components within the frequency band of interest. Thus, the DC offset cannot be filtered from the scaled audio signal once it is produced.

Another solution to eliminate the DC offset and resulting audible "pop" is to use a series of five fixed gain operational amplifiers to provide 32 different amplitude levels, or volume settings. The operational amplifiers are intercoupled to binarily divide the received full scale audio signal in to the 32 different settings. While this technique eliminates the DC offset, it is part intensive, which adds cost and printed circuit board or integrated circuit real estate.

Thus, there exists a need in the art for circuitry that provides a scaled representation of an analog signal such that the scaled representation of the analog signal has zero DC offset without the cost of known prior art implementations.

DETAILED DESCRIPTION OF THE DRAWINGS

The present invention provides an amplitude or volume adjust circuit for producing a scaled representation of an analog audio signal such that the scaled representation of the analog audio signal has zero DC offset. The volume adjust circuit preferably comprises a voltage reference generator, an operational amplifier, offsetting circuit, and an impedance network. The voltage reference generator produces a voltage reference that inputs to the operational amplifier which also receives an input from the offsetting circuit. The offsetting circuit receives an analog audio signal and offsets the analog audio signal by a DC component wherein the DC component substantially equals the voltage reference. The offsetting circuit therefore provides an output having a DC component substantially equal to the voltage reference. The impedance network operably couples to the operational amplifier and to the voltage reference such that both ends of the impedance network have a DC value equivalent to the voltage reference. The impedance network includes a plurality of impedances wherein, based upon a volume select signal, one of the impedances selected provides a scaled representation of the analog audio signal. Because both side of the impedance network are held at the voltage reference potential, each scaled analog audio signal has a constant DC value, and thus zero DC offset.

Figure 1:
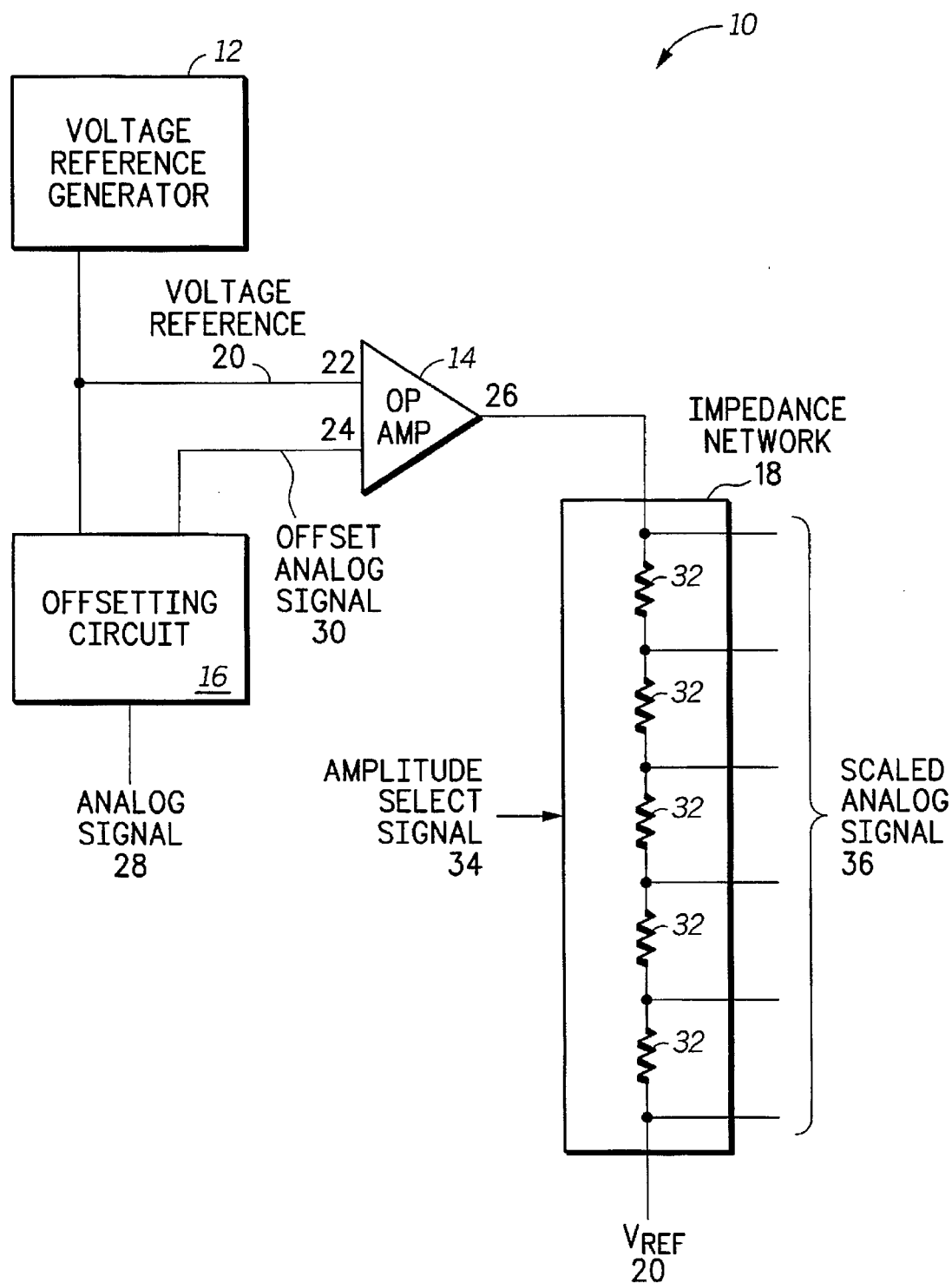
FIG. 1 illustrates a schematic block diagram of a amplitude adjust circuit incorporating the principles of the invention.

FIG. 1 illustrates an amplitude adjust circuit 10 comprising voltage reference generator 12, operational amplifier 14, offsetting circuit 16, and impedance network 18. The voltage reference generator 12 produces a voltage reference 20. The voltage reference 20 level is selected in conjunction with the requirements of the circuit elements within the amplitude adjust circuit 10. The voltage reference 20 preferably is temperature and time independent to provide a constant voltage level over all operational conditions of concern.

The operational amplifier has a first input 22, a second input 24, and an output 26, wherein the first input 22 is coupled to the voltage reference 20. The offsetting circuit 16 operably couples to the second input 24 of the operational amplifier 14. The offsetting circuit 16 receives the voltage reference 20 and an analog signal 28 (which may be an audio signal), offsets the analog audio signal by a DC component, and produces an offset analog signal 30 which is provided to the second input 24 of the operational amplifier 14. The DC component, by which the analog signal 28 is offset, is substantially equal to the reference voltage 20 such that the DC level applied across the first input 22 and the second input 24 of the operational amplifier 14 is zero. Thus, a signal present at the output 26 of the operational amplifier 14 is a full scale audio signal representing the analog signal 28 but having a DC level at the reference voltage 20.

The impedance network 18 operably couples to the output 26 of the operational amplifier 14. The impedance network 18 includes a plurality of impedances 32, wherein, based on a volume, or amplitude, select signal 36, one of the plurality of impedances 32 is selected to provide a scaled representation 36 of the analog signal 28. A second side of the impedance network 18 connects to the voltage reference 20. Thus, there is no DC voltage across the impedance network 18 and the scaled audio signal 36 at each point on the impedance network 18 has the same DC voltage. When another of the plurality of impedances 32 is selected, the scaled analog signal 36 provided as an output of the impedance network 18 has substantially zero DC offset (less than 10 mV).

Thus, the amplitude adjust circuit 10 of the present invention provides the important benefit of producing a scaled analog signal 36 that has zero DC offset. In this fashion, using the amplitude adjust circuit 10 of the present invention to scale an analog signal 28, no audible "pops" or large magnitude signals will be produced that would annoy a listener or damage a speaker receiving the scaled analog signal 36. Thus, the amplitude adjust circuit 10 of the present invention provides important benefits not previously provided by the prior art series impedance circuit.

Figure 2:
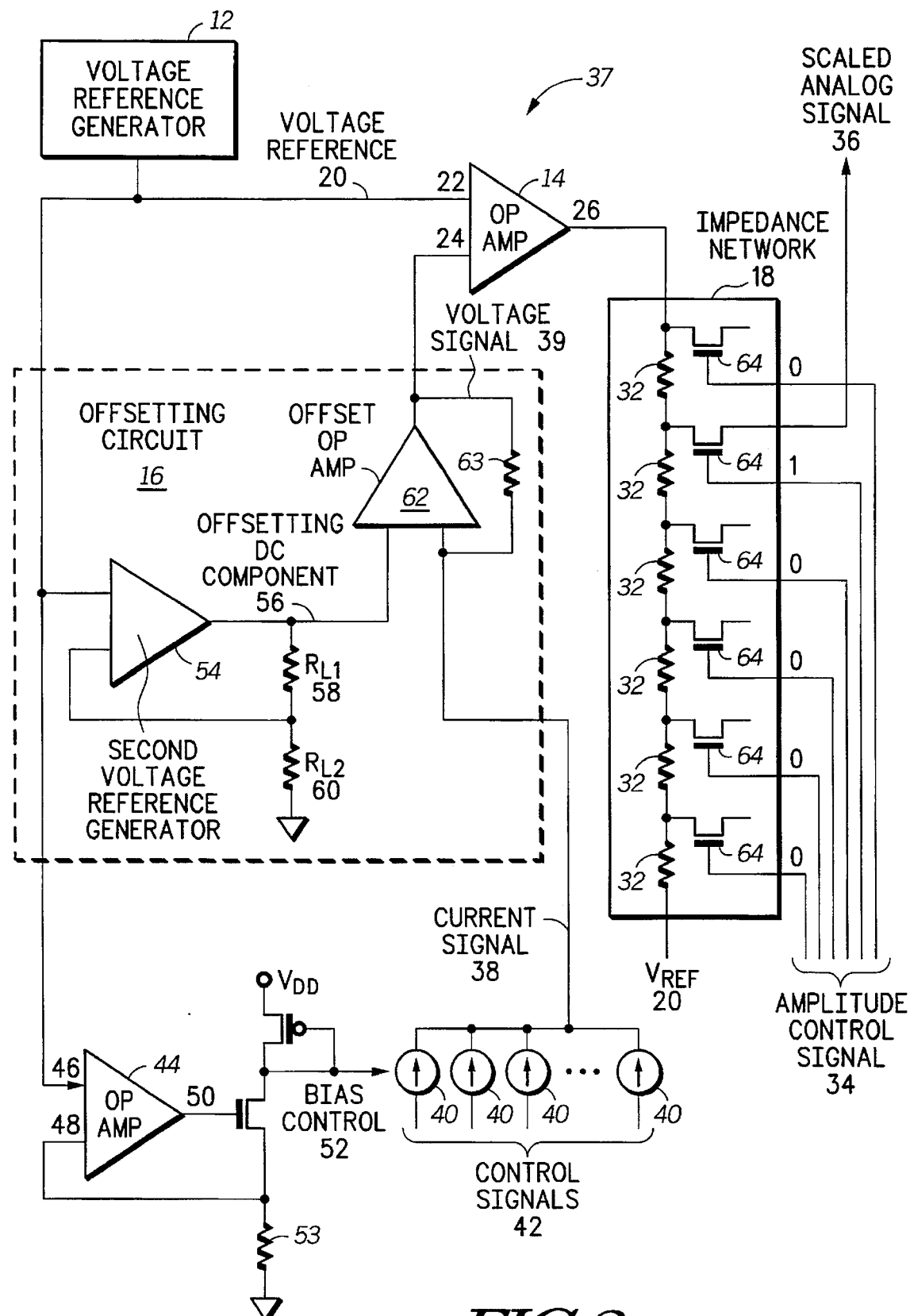
FIG. 2 illustrates a schematic block diagram of the amplitude adjust circuit of FIG. 1 in greater detail.

FIG. 2 illustrates an amplitude adjust circuit 37 incorporating the principles of the amplitude adjust circuit 10 of FIG. 1 and shown with additional detail. The amplitude adjust circuit 37 preferably comprises voltage reference generator 12, operational amplifier 14, offsetting circuit 16, and impedance network 18. Preferably, the amplitude adjust circuit 37 further comprises another operational amplifier 44 that provides a biasing control signal 52 to a plurality of current sources 40. Those components having functions substantially identical to the components described with reference to FIG. 1 will not be further described herein unless required for clarification.

The voltage reference generator 12 provides a voltage reference 20 to the first input 22 of the operational amplifier 14. The offsetting circuit 16 provides a second input 24 to the operational amplifier 14. The offsetting circuit 16 preferably comprises a second voltage reference generator 54 and an offsetting operational amplifier 62. The second voltage reference generator 54 produces an offsetting DC component 56. The offsetting DC component 56 is based upon two load resistors connected to the output of the second voltage reference generator 54. $R_{L1}$ 58 and $R_{L2}$ 60 determine the magnitude of the offsetting DC component 56. A first input of the second voltage reference generator 54 couples to the voltage reference 20 such that the offsetting DC component 56 is a scaled representation of the voltage reference 20, wherein the scaling is based on the relationship between $R_{L1}$ 58, $R_{L2}$ 60, resistor 53, and resistor 63.

The offsetting DC component 56 couples to a first input of the offsetting operational amplifier 62. The second input of the offsetting operational amplifier 62 receives a current signal 38 containing analog audio information. The offsetting operational amplifier 62 converts the current signal 38 to a voltage signal 39 via resistor 63. The voltage signal 39 couples to the second input 24 of the operational amplifier 14 and has a DC component fixed at the voltage reference 20. As one skilled in the art will readily appreciate, the offsetting operational amplifier 62 serves not only to offset its output to the level of the DC level of the voltage reference 20 but to convert the current signal 38 to a voltage signal 39 with the desired DC voltage level. As one skilled in the art will further appreciate, the load resistances associated with the second voltage reference generator 54 are selected so that the offsetting operational amplifier 62 converts the current signal 38 to a voltage signal 39 with the proper DC voltage level.

The current signal 38 is provided by a plurality of current sources 40 that are selectively enabled or disabled by control signals 42. The current source 40 serves to reconstruct a current signal based upon a digital representation of an analog signal. Another operational amplifier 44 has its first input 46 coupled to the voltage reference 20, and its second input operably coupled to its output 50, a resistor, and a transistor circuit that couples to a source voltage. The operational amplifier 44 provides a biasing control signal 52 to the plurality of current sources 40. The feedback provided by the voltage reference 20 signal through the operational amplifier 44 to the plurality of current sources 40 helps to insure that the voltage signal 39 created by the offset operational amplifier 62 includes a DC magnitude equal to the voltage reference 20. Circuitry connected to the output of the operational amplifier 50 is selected based upon the control requirements of the biasing control signal 52 and the other components in the volume adjust circuit 37.

The impedance network 18 comprises a plurality of resistors 32 operably coupled to a plurality of enabling transistors 64. As one skilled in the art will readily appreciate, other components besides resistors could be employed as voltage dividers. However, for simplicity, resistors will be described in connection with FIG. 2. The plurality of resistors 32 is connect in series to create a circuit with a first end and a second end. The first end of the circuit connects to the output 26 of the operational amplifier 14 while the second end of the circuit connects to the voltage reference 20. Thus, each end of the impedance network 18 is held at a DC level of the voltage reference 20.

The plurality of enabling transistors 64 are controlled by the amplitude control signal 34 such that only one of the plurality of transistors 64 is turned on at a time. However, one skilled in the art will readily appreciate how the impedance network 18 could be operated in other manners consistent with the goals of circuit 37. The transistor 64, which is enabled, provides a scaled audio signal 36 as an output. As one skilled in the art will readily appreciate, the impedance network 18 provides a range of analog signals from the full analog audio signal to a very small scale component thereof. The scaled analog signal 36 provided by the impedance network 18 has substantially zero DC offset since the DC voltage across each resistors 32 of the impedance network 18 is zero. However, the non DC components of the scaled audio signal 36 include relative frequency components identical to those of the current signal 38.

Figure 3:
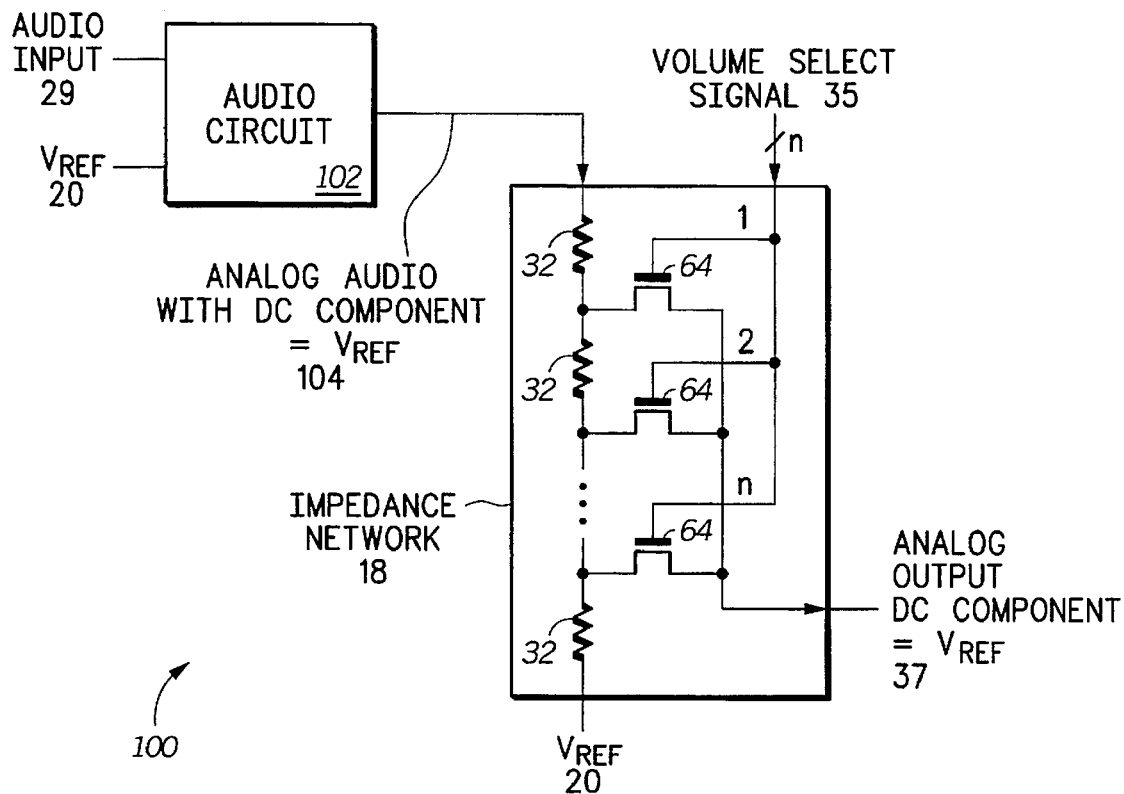
FIG. 3 illustrates a schematic block diagram of a volume adjust circuit incorporating the principles of the present invention.

FIG. 3 illustrates a volume adjust circuit 100 comprising an audio circuit 102 and an impedance network 18. The audio circuit 102 produces an analog signal 104 based on a reference voltage 20 and an audio input 29. The impedance network 18 operably couples to the audio circuit 102. The impedance network 18 includes a plurality of impedances 32 that are preferably resistors but could be other impedances known in the art that act as voltage dividers when connected in series. Based on a volume select signal 35, one of the plurality of impedances 32 is selected to provide a scaled representation of the analog audio signal 36. Preferably, one of the plurality of impedances is selected via a respective enabling transistor 64 by the volume select signal 35. A second end of the impedance network 18 is tied to the voltage reference 20 such that the DC voltage level on each side of the impedance network 18 is identical. In this fashion, the analog output 36 has a DC component with substantially zero DC offset relative to the voltage reference 20. Thus, the volume adjust circuit 100 illustrated provides the important benefit of scaling an analog audio input signal 29 to provide an analog output signal 37 with a DC component fixed at a voltage reference, or alternately having zero DC offset.

Figure 4:
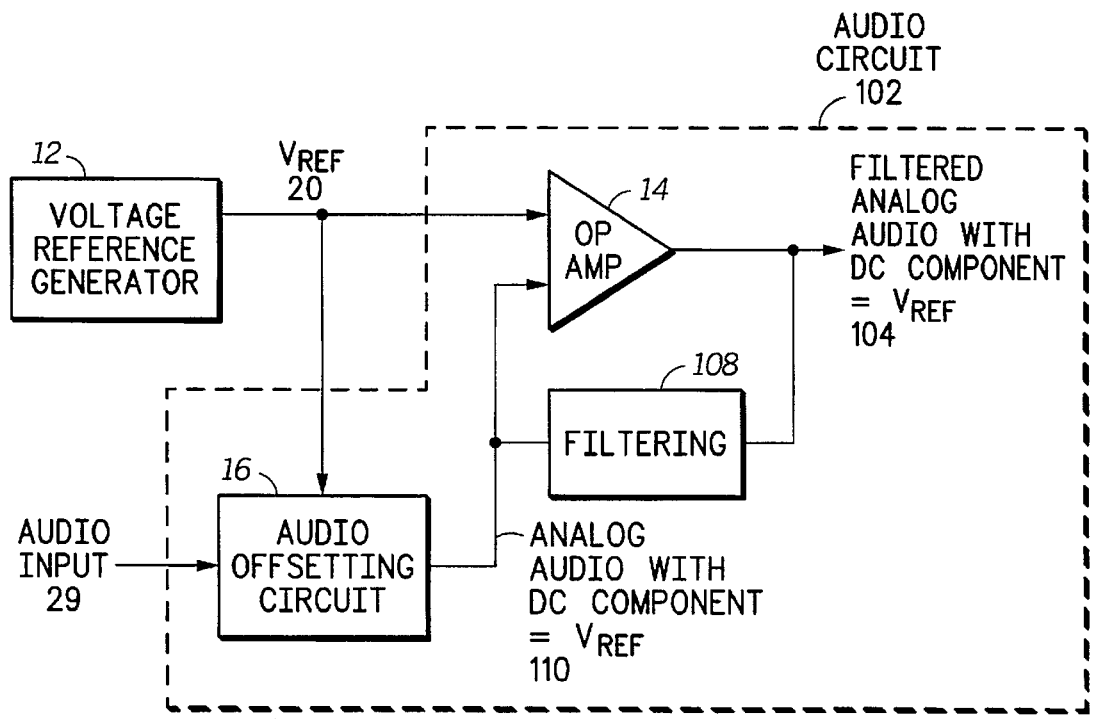
FIG. 4 illustrates a schematic block diagram of the volume adjust circuit of FIG. 3 in more detail.

FIG. 4 illustrates the audio circuit 102 of FIG. 3 in more detail. The audio circuit 102 comprises an operational amplifier 14 and an audio offsetting circuit 16. The audio offsetting circuit 16 receives the audio input signal 29 and the voltage reference 20 from a voltage reference generator 12. The voltage reference 20 serves as a first signal to the operational amplifier 14. The audio offsetting circuit 16 provides an analog audio output signal 110 having a DC component equal to the voltage reference 20 which is coupled to the operational amplifier 14 at a second input.

Coupled between the second input of the operational amplifier 14 and the output of the operational amplifier is at least one filtering element 108. The filtering element 108 establishes a frequency response for the operational amplifier 14 such that the analog audio signal 110 is filtered to produce a filtered analog audio signal 104. The filtered analog audio signal 104, which has a DC level equal to the voltage reference 20, is then applied to the impedance network 18 such that the scaled analog output 36 also has a DC component equal to the voltage reference 20. Thus, the volume adjust circuit 100 illustrated in FIG. 4 provides the important benefit of providing the scaled analog output signal having substantially zero DC offset relative to the reference voltage 20.

Figure 5:
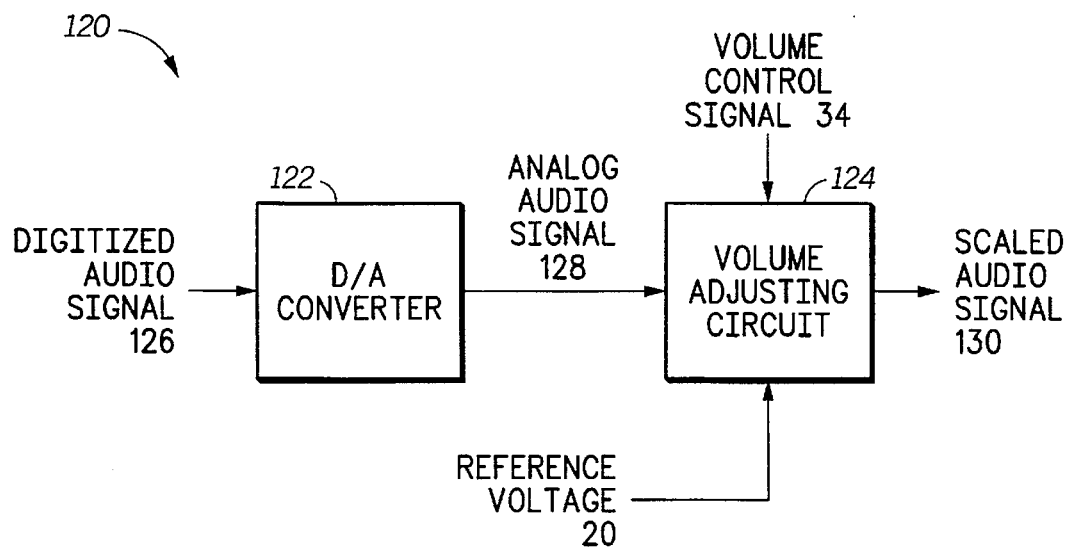
FIG. 5 illustrates a schematic block diagram of a digitized audio signal converter incorporating the principles of the present invention.

FIG. 5 illustrates a digitized audio signal converter 120 comprising a digital analog converter 122 and a volume adjusting circuit 124. The digital analog converter 122 receives a digitized audio signal 126 and converts the digitized audio signal 126 to an analog audio signal 128. The conversion of digitized audio signals 126 to analog audio signals 128 is known in the art and is not further described herein except to illustrate the teachings of the present invention.

The volume adjusting circuit 124 operably couples to the digital to analog converter 122 to receive the analog audio signal 128. The volume adjusting circuit 124 also receives a reference voltage 20 and produces a scaled audio signal 130 based on a volume control signal 35. Note that the scaled audio signal 130 has, with respect to the voltage reference 20, a substantially zero DC component. Thus, when the volume control signal 35 is adjusted, the DC component of the scaled audio signal 130 remain substantially unchanged. In this fashion, the digitized audio signal converter 120 of the present invention provides, based upon the digitized audio signal 126, a scaled audio signal 130, with zero DC offset. This important benefit has not been provided by the prior art devices.

Figure 6:
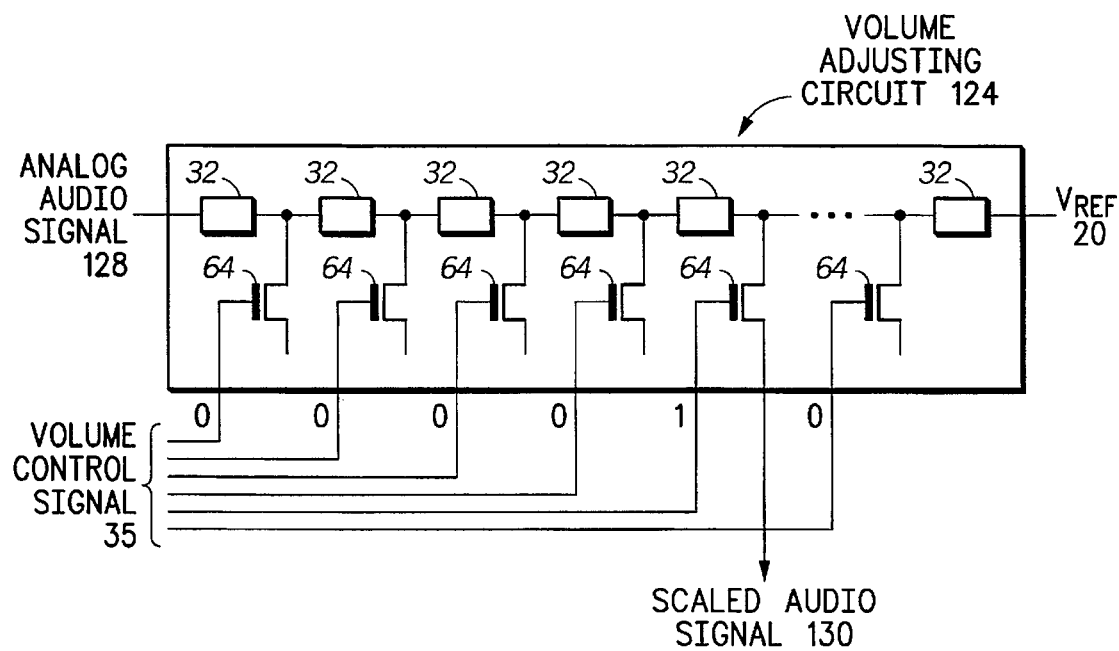
FIG. 6 illustrates a block diagram of a volume adjusting circuit associated with the digitized audio signal converter of FIG. 5.

FIG. 6 illustrates a volume adjusting circuit 124 of the digitized audio signal converter 120. Preferably, the volume adjust circuit 124 comprises a plurality of series impedances 32 and a plurality of enabling transistors 64. The plurality of series impedances 32 include a first end that receives an analog audio signal 128 and a second end that couples to the voltage reference 20. The plurality of enabling transistors 64 are controlled by the volume control signal 35. The volume control signal 35 comprises a signal having N bits of width, wherein N represents the number of selection transistors 64. The volume control signal 35 includes a single enabled bit with (N−1) disabled bits, such that only one of the enabling transistors 64 is turned on at any given time. One skilled in the art will readily appreciate that any of the selection transistors 64 could be enabled to provide a scaled audio signal 130 having a desired magnitude. Further, one skilled in the art will readily appreciate that the number of series impedances 132 and selection transistors 64 could be varied to provide more or less tap points. Thus, fine or coarse adjustments to the analog audio signal 128 could be provided by the design of the volume adjusting circuit 124.

Figure 7:
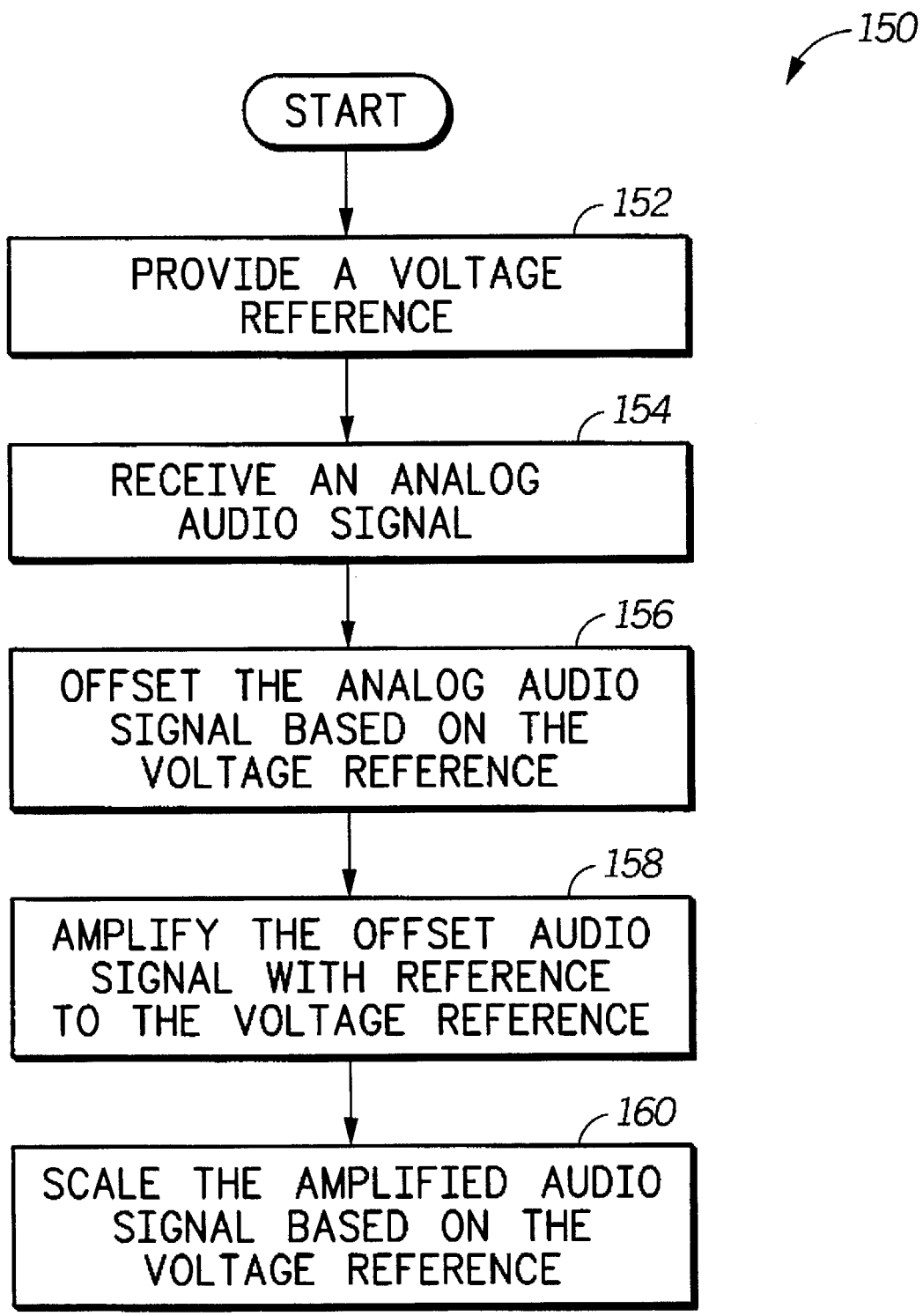
FIG. 7 illustrates a logic diagram of a method for producing an audio signal with an adjusted volume in accordance with the principles of the present invention.

FIG. 7 illustrates a method 150 for producing an audio signal with an adjusted volume incorporating the principles of the present invention. The method includes a first step 152 of providing a voltage reference. Next, at step 154, the method 150 includes receiving an analog audio signal. From step 154, the method proceeds to step 156, wherein offsetting the analog audio signal based on the voltage reference to produce an offset audio signal is performed. Once the offset audio signal is produced, the method proceeds to step 158, wherein the step of amplifying the offset audio signal, with respect to the voltage reference, to produce an amplified audio signal is performed. Next, at step 160, the method includes scaling the amplified audio signal based on the voltage reference to produce an adjusted output. Thus, in accordance with the steps of the method 150 of the present invention, an audio signal with an adjusted volume is produced, the audio signal having zero DC offset. Thus, using the method 150 of the present invention, an adjusted audio signal may be produced without problems associated with a signal having a DC offset.

The above described preferred embodiments are intended to illustrate the principles of the invention, but not to limit the scope of the invention. Various other embodiments and modifications to these preferred embodiments may be made by those skilled in the art without departing from the scope of the following claims.

We claim:

1. An amplitude adjust circuit comprising:

voltage reference terminal for receiving voltage reference;

operational amplifier having a first input, a second input, and an output, wherein the first input is coupled to the voltage reference;

offsetting circuit operably coupled to the second input, wherein the offsetting circuit receives an analog signal and offsets the analog signal by a DC component wherein the DC component substantially equals the voltage reference; and impedance network operably coupled to the output and the voltage reference generator, wherein the impedance network includes a plurality of impedances, wherein, based on an amplitude select signal, one of the plurality of impedances is selected to provide a scaled representation of the analog signal such that the scaled representation of the analog signal has a substantially zero DC offset.

2. The amplitude adjust circuit of claim 1 wherein the analog signal comprises a current signal.

3. The amplitude adjust circuit of claim 2 wherein the offsetting circuit comprises an offset operational amplifier that converts the current signal to a voltage signal, the offset operational amplifier having a first input coupled to receive the current signal, a second input coupled to receive an offsetting DC component, and an output operably coupled to the second input of the operational amplifier.

4. The amplitude adjust circuit of claim 3 wherein the offsetting circuit further comprises voltage reference generator that generates the offsetting DC component, the voltage reference generator includes an operational amplifier having the voltage reference as a first input and a scaled version of its output as a second input, wherein scaling is based on a load resistance.

5. The amplitude adjust circuit of claim 3 further comprises another operational amplifier having the voltage reference as an input, wherein the another operational amplifier provides control to at least one current source generating the current signal.

6. The amplitude adjust circuit of claim 1 wherein the plurality of impedances comprise a plurality of resistors operably coupled to a plurality of enabling transistors.

7. The circuit of claim 1, wherein the voltage reference generator generates a voltage not substantially equal to zero volts.

8. A method for adjusting an amplitude of an analog audio signal, the method comprising the steps:

a) operably coupling a reference voltage to a first input of an operational amplifier;

b) operably coupling an analog audio signal to a second input of the operational amplifier;

c) biasing a voltage at the second input substantially at the reference voltage;

d) operably coupling an output of the operational amplifier to a first end of an impedance network;

e) operably coupling a second end of the impedance network to the reference voltage; and f) providing a scaled representation of the analog audio signal at a tap point of the impedance network such that the scaled representation of the analog audio signal has a substantially zero DC offset.

9. An amplitude adjust circuit comprising:

audio circuit that produces an analog audio signal based on a reference voltage and an audio input, the audio circuit comprising:

voltage reference terminal that receives the reference voltage operational amplifier having a first input, a second input, and an output, wherein the first input is coupled to the reference voltage; and offsetting circuit operably coupled to the second input, wherein the offsetting circuit receives the analog audio signal and offsets the analog audio signal by a DC component wherein the DC component substantially equals the reference voltage: and impedance network operably coupled to the audio circuit, wherein the impedance network includes a plurality of impedances, wherein, based on a amplitude select signal, one of the plurality of impedances is selected to provide a scaled representation of the analog audio signal, the scaled representation of the analog audio signal having a substantially zero DC offset.

10. The amplitude adjust circuit of claim 9 wherein the analog audio signal comprises a current signal.

11. The amplitude adjust circuit of claim 10 wherein the offsetting circuit comprises a second operational amplifier that converts the current signal to a voltage signal, the second operational amplifier having a first input coupled to receive the current signal, a second input to receive an offsetting DC component, and an output operably coupled to the second input of the operational amplifier.

12. The amplitude adjust circuit of claim 11 wherein the offsetting circuit further comprises a reference generator that generates the DC component, the reference generator includes another operational amplifier having the reference voltage as a first input and a scaled version of its output as a second input, wherein scaling is based on a load resistance.

13. The amplitude adjust circuit of claim 11 further comprises another operational amplifier having the reference voltage as an input, wherein the another operational amplifier provides control to a current source generating the current signal.

14. An amplitude adjust circuit for an analog audio signal comprising:

voltage reference generator that produces a voltage reference;

operational amplifier having a first input, a second input, and an output, wherein the first input is coupled to the voltage reference;

offsetting circuit operably coupled to the second input, wherein the offsetting circuit receives the analog audio signal and offsets the analog audio signal by a DC component wherein the DC component substantially equals the voltage reference; and impedance network operably coupled to the output and the voltage reference generator, wherein the impedance network includes a plurality of impedances, wherein, based on an amplitude select signal, one of the plurality of impedances is selected to provide a scaled representation of the analog signal such that the scaled representation of the analog audio signal has a substantially zero DC offset.

* * * * *